United States Patent [19]

Miyake et al.

[11] Patent Number: 5,382,917
[45] Date of Patent: Jan. 17, 1995

[54] AMPLIFIER CIRCUIT

[75] Inventors: Hideki Miyake; Tsutomu Kamifuji, both of Itami, Japan

[73] Assignee: Mitsubishi Denki Kabushiki Kaisha, Tokyo, Japan

[21] Appl. No.: 117,687

[22] Filed: Sep. 8, 1993

[30] Foreign Application Priority Data

Nov. 30, 1992 [JP] Japan .................. 4-319881

[51] Int. Cl.6 ........................................... H03F 3/45
[52] U.S. Cl. ............................ 330/255; 330/257; 330/261
[58] Field of Search ............... 330/252, 255, 257, 258, 330/295, 261

[56] References Cited

U.S. PATENT DOCUMENTS

| 4,377,789 | 3/1983 | Hoover | 330/257 X |
| 4,532,479 | 7/1985 | Blauschild | 330/252 X |
| 5,294,892 | 3/1994 | Ryat | 330/255 X |

Primary Examiner—James B. Mullins
Attorney, Agent, or Firm—Oblon, Spivak, McClelland, Maier & Neustadt

[57] ABSTRACT

There is disclosed an amplifier circuit wherein a first differential amplifier consisting of an I/O circuit (11) and a constant-current circuit (31) and a second differential amplifier consisting of an I/O circuit (12) and a constant-current circuit (32) are connected to both first and second input terminals (1, 2), and current synthesizing circuits (21 to 24) synthesize the signals output from the first and second differential amplifiers to apply the synthesized signal to a current-to-voltage converter circuit (9), and wherein a clamp circuit (51) inhibits the operation of the first differential amplifier when the input signals at the input terminals (1, 2) are not less than $(V_{cc}-V_{sat})$, and a clamp circuit (52) inhibits the operation of the second differential amplifier when the input signals at the input terminals (1, 2) is not more than $V_{sat}$. The second and first amplifiers substantially process the input signals which deviate from first and second ranges, respectively, to apply the output signal to the output terminal, thereby achieving the amplifier circuit having a wide input signal potential range.

23 Claims, 13 Drawing Sheets

AMPLIFIER CIRCUIT

BACKGROUND OF THE INVENTION

1. Field of the Invention

The present invention relates to an amplifier circuit which allows a wide potential range of input signals.

2. Description of the Background Art

FIG. 11 is a block diagram showing positioning control of a magnetic head of an HDD (hard disk drive) device. For moving the magnetic head to a track specified by a desired value T, a signal processing circuit SP drives a motor driver MD through an operational amplifier OP and a filter FL. The motor driver MD actuates a motor M. Consequently, a sensor SN senses the position of the moved magnetic head to apply the position information to the signal processing circuit SP through a position detecting circuit PD. The signal processing circuit SP applies a motor control signal MS to the operational amplifier OP in full consideration of the desired value T and the position information.

When the position of the magnetic head deviates largely from the desired value, a large motor control signal MS is applied to the operational amplifier OP. Being used as a voltage follower, the operational amplifier OP, if having an insufficient dynamic range of the input signal potential range, cannot drive the motor driver MD suitably.

Thus desirable is a large dynamic range of the input signal potential range of the operational amplifier OP.

FIG. 12 is a circuit diagram of an operational amplifier 2000 that is an example of conventional amplifier circuits. The operational amplifier 2000 processes input signals given from a non-inverting input terminal 1 and an inverting input terminal 2 to apply an output signal to an output terminal 3.

The potential range of the input signal allowed to be inputted to the input terminals 1 and 2 of the operational amplifier 2000 is limited not only by a potential $V_{cc}$ at a potential point 4 and a potential GND (=0) at a potential point 5 but also by a saturation voltage $V_{sat}$ of a transistor 302 and a base-emitter voltage $V_{BE}$ of transistors 101 and 102.

The upper limit of the input signal potential range is limited to $\{V_{cc} - (V_{sat} + V_{BE})\}$.

The operational amplifier as an example of the conventional amplifier circuits presents the problem that its input signal potential range is limited by the saturation voltage and base-emitter voltage of the transistors forming the operational amplifier.

There has recently been a tendency toward the requirement of a low power supply voltage $V_{cc}$, while the saturation voltage $V_{sat}$ and base-emitter voltage $V_{BE}$ of the transistors are not greatly reduced. Therefore the dynamic range of the input signal potential range deteriorates as the power supply voltage $V_{cc}$ decreases.

SUMMARY OF THE INVENTION

According to the present invention, an amplifier circuit comprises: a first input terminal receiving a first signal; a second input terminal receiving a second signal; the first and second signals being adapted to take a first, relatively low value, a second, relatively high value, and third to fifth values; an output terminal; a first amplifier for outputting a signal responsive to the first and second signals when at least one of the first and second signals falls in a first range, the first range not including the third value which is more than the first value and not more than the second value but including the fourth value which is not less than the first value and less than the third value and the fifth value which is less than the third value and more than the fourth value; and a second amplifier for outputting a signal responsive to the first and second signals when at least one of the first and second signals falls in a second range, the second range not including the fourth value but including the third and fifth values, wherein the signal output from the first amplifier and the signal output from the second amplifier are synthesized, so that the synthesized signal is applied to the output terminal.

According to the basic feature of the present invention, the first amplifier substantially applies the output to the output terminal when both of the first and second signals are included in the first range and neither of them is included in the second range. Conversely, the second amplifier substantially applies the output to the output terminal when both of them are included in the second range and neither of them is included in the first range.

As above described, since the second amplifier substantially applies the output to the output terminal when the first and second signals deviate from the first range and so does the first amplifier when the first and second signals deviate from the second range, the first and second signals have a wider allowable range. Connection between the second input terminal and the output terminal provides for a buffer having a preferable dynamic range of the input signals.

Preferably, the first amplifier includes: first input/output means having first and second inputs connected to the first and second input terminals, respectively, first and second outputs, and a first connecting point; and a first constant-current source connected to the first input/output means at the first connecting point for supplying a first predetermined current to the first input/output means, the first amplifier distributing the first predetermined current in response to the first and second signals to output the distributed currents to the first and second outputs thereof. The second amplifier includes: second input/output means having first and second inputs connected to the first and second input terminals, respectively, first and second outputs, and a second connecting point; and a second constant-current source connected to the second input/output means at the second connecting point for supplying a second predetermined current to the second input/output means, the second amplifier distributing the second predetermined current in response to the first and second signals to output the distributed currents to the first and second outputs thereof.

Preferably, the amplifier circuit further comprises: output synthesizing means for synthesizing the signal output from the first amplifier and the signal output from the second amplifier to apply the synthesized signal to the output terminal.

Preferably, the amplifier circuit further comprises: first control means for inhibiting the operation of the first amplifier when both of the first and second signals deviate from the first range; and second control means for inhibiting the operation of the second amplifier when both of the first and second signals deviate from the second range.

Preferably, the amplifier circuit further comprises: first current compensating means connected to the first and second input terminals for compensating for a current entering the first amplifier; and second current compensating means connected to the first and second input terminals for compensating for a current entering the second amplifier.

Preferably, the amplifier circuit further comprises: third control means connected to the first current compensating means for inhibiting the operation of the first current compensating means when both of the first and second signals deviate from the first range; and fourth control means connected to the second current compensating means for inhibiting the operation of the second current compensating means when both of the first and second signals deviate from the second range.

According to this feature, the currents entering the first and second amplifiers are compensated for. Since both of the first and second amplifiers are connected to the first and second input terminals, the first and second current compensating means suppress the current flow to the first and second input terminals. The provision of the third and fourth control means, in particular, prevents the back flow of the compensating current of the first and second compensating means to the first and second input terminals.

The input impedance of the amplifier circuit is therefore increased.

Preferably, the first amplifier further includes a first voltage follower circuit between the first and second input terminals and the first input/output means, and the second amplifier further includes a second voltage follower circuit between the first and second input terminals and the second input/output means.

Preferably, the first voltage follower circuit includes first level-shift means, and the second voltage follower circuit includes second level-shift means.

According to this feature, the voltage follower circuits inhibit the current flow to the first and second input terminals, Particularly, the provision of the first and second level-shift means enables the first and second ranges to be expanded.

This also increases the input impedance of the amplifier circuit. In particular, the allowable range of the first and second signals when the level-shift means are provided are wider than that of the basic feature.

An object of the present invention is to provide an amplifier circuit that allows a wide potential range of input signals.

These and other objects, features, aspects and advantages of the present invention will become more apparent from the following detailed description of the present invention when taken in conjunction with the accompanying drawings.

DESCRIPTION OF THE PREFERRED EMBODIMENTS

FIRST PREFERRED EMBODIMENT

Figure 1:
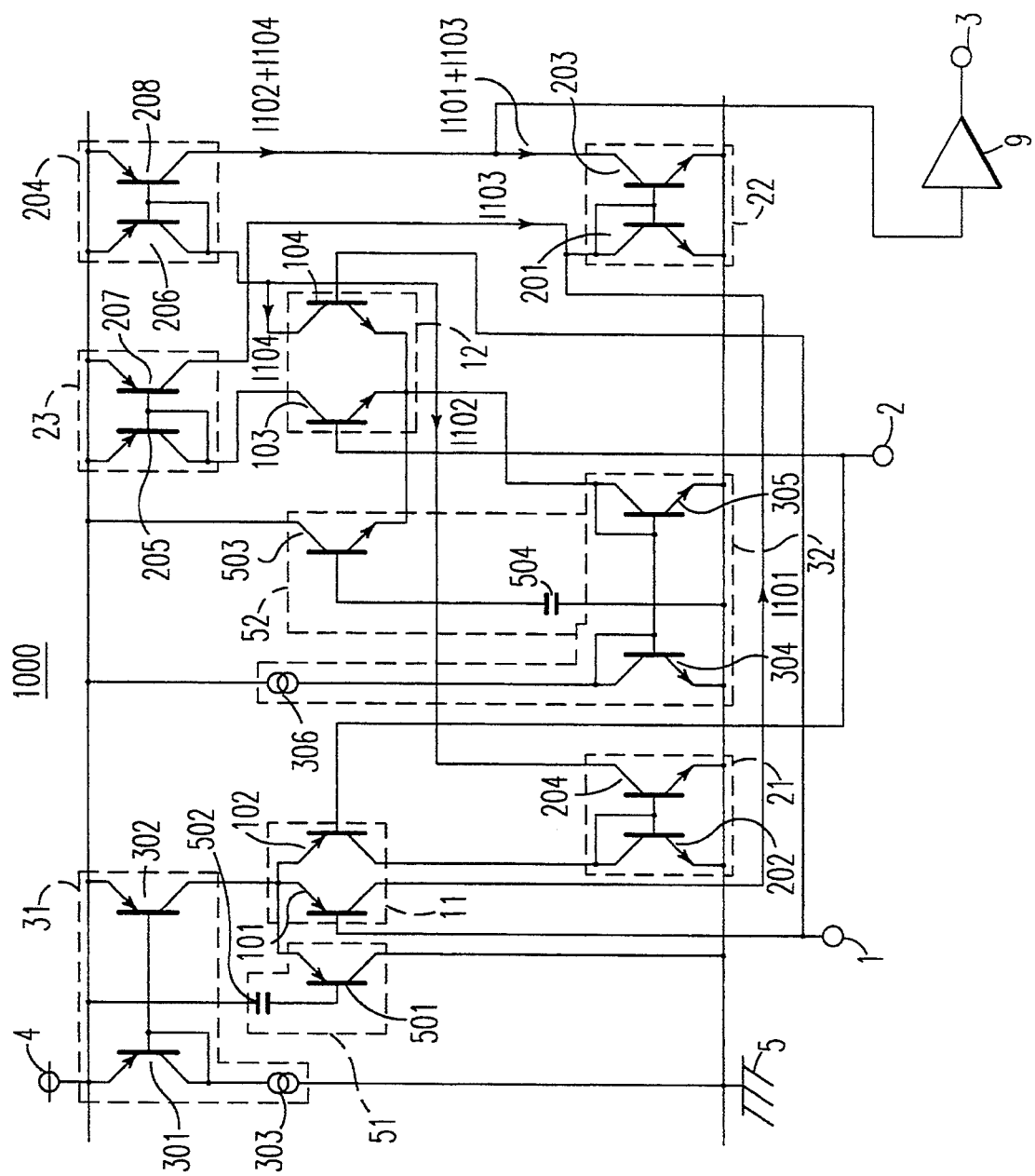
FIG. 1 is a circuit diagram of an amplifier circuit according to a first preferred embodiment of the present invention.

FIG. 1 is a circuit diagram of an operational amplifier 1000 according to a first preferred embodiment of the present invention. The operational amplifier 1000 comprises a non-inverting input terminal 1, an inverting input terminal 2, and an output terminal 3. A voltage applied between the input terminals 1 and 2 are processed, and the output terminal 3 provides the resultant potential.

I/O circuits 11, 12, current synthesizing circuits 21 to 24, constant-current circuits 31, 32, and clamp circuits 51, 52 are provided between a potential point 4 having a potential $V_{cc}$ ($>0$) and a potential point 5 grounded (having the zero potential (GND)).

A current-to-voltage converter circuit 9 is provided between the outputs of the current synthesizing circuits 22, 24 and the output terminal 3 to convert the current outputted from the current synthesizing circuits 22, 24 into voltage.

The I/O circuit 11 and the constant-current circuit 31 are paired to form a first differential amplifier, and the I/O circuit 12 and the constant-current circuit 32 are paired to form a second differential amplifier. The current synthesizing circuits 21 to 24 function to synthesize the outputs of the first and second differential amplifiers.

The current synthesizing circuit 21 includes a current mirror circuit consisting of transistors 202 and 204. The emitter of the transistor 202 and the emitter of the transistor 204 are connected in common to the potential point 5. The base of the transistor 202 and the base of the transistor 204 are connected in common to the collector of the transistor 202.

Likewise, the current synthesizing circuit 22 includes a current mirror circuit consisting of transistors 201 and 203. The emitter of the transistor 201 and the emitter of the transistor 203 are connected in common to the potential point 5. The base of the transistor 201 and the base of the transistor 203 are connected in common to the collector of the transistor 201.

In a like manner, the current synthesizing circuit 23 includes a current mirror circuit consisting of transistors 205 and 207. The emitter of the transistor 205 and the emitter of the transistor 207 are connected in common to the potential point 4. The base of the transistor 205 and the base of the transistor 207 are connected in common to the collector of the transistor 205.

Likewise, the current synthesizing circuit 24 includes a current mirror circuit consisting of transistors 206 and 208. The emitter of the transistor 206 and the emitter of the transistor 208 are connected in common to the potential point 4. The base of the transistor 206 and the base of the transistor 208 are connected in common to the collector of the transistor 206.

The I/O circuit 11 includes transistors 101 and 102. The collector of the transistor 101 is connected to the collector of the transistor 201 of the current synthesizing circuit 22. The collector of the transistor 102 is connected to the collector of the transistor 202 of the current synthesizing circuit 21.

Similarly, the I/O circuit 12 includes transistors 103 and 104. The collector of the transistor 103 is connected to the collector of the transistor 205 of the current synthesizing circuit 23. The collector of the transistor 104 is connected to the collector of the transistor 206 of the current synthesizing circuit 24.

The current synthesizing circuits 21 and 24 are connected to each other through the collector of the transistor 104. That is, the collector of the transistor 204 of the current synthesizing circuit 21 is connected to the collector of the transistor 104.

The current synthesizing circuits 22 and 23 are connected to each other through the collector of the transistor 101. That is, the collector of the transistor 201 of the current synthesizing circuit 22 is connected to the collector of the transistor 207 of the current synthesizing circuit 23.

The current synthesizing circuits 22 and 24 are connected to each other. That is, the collector of the transistor 203 of the current synthesizing circuit 22 is connected to the collector of the transistor 208 of the current synthesizing circuit 24. The collectors of the transistors 203 and 208 are connected in common to the input of the current-to-voltage converter circuit 9.

The constant-current circuit 31 includes transistors 301 and 302 forming a current mirror circuit, and a current source 303. That is, the emitter of the transistor 301 and the emitter of the transistor 302 are connected in common to the potential point 4. The base of the transistor 301 and the base of the transistor 302 are connected in common to the collector of the transistor 301. The current source 303 is connected between the collector of the transistor 301 and the potential point 5.

The collector of the transistor 302 is connected to both of the emitters of the transistors 101 and 102 of the I/O circuit 11.

Likewise, the constant-current circuit 32 includes transistors 304 and 305 forming a current mirror circuit, and a current source 306. That is, the emitter of the transistor 304 and the emitter of the transistor 305 are connected in common to the potential point 5. The base of the transistor 304 and the base of the transistor 305 are connected in common to the collector of the transistor 304. The current source 306 is connected between the collector of he transistor 304 and the potential point 4.

The collector of the transistor 305 is connected to both of the emitters of the transistors 103 and 104 of the I/O circuit 12.

The clamp circuit 51 includes a transistor 501 and a voltage source 502. The voltage source 502 has a positive electrode connected to the potential point 4 and a negative electrode connected to the base of the transistor 501. The emitter of the transistor 501 is connected to both of the emitters of the transistors 101 and 102 of the I/O circuit 11. The collector of the transistor 501 is connected to the potential point 5.

Similarly, the clamp circuit 52 includes a transistor 503 and a voltage source 504. The voltage source 504 has a negative electrode connected to the potential point 5 and a positive electrode connected to the base of the transistor 503. The emitter of the transistor 503 is connected to both of the emitters the transistors 103 and 104 of the I/O circuit 12. The collector of the transistor 503 is connected to the potential point 4.

In such an arrangement, the transistors 101, 102, 205, 206, 207, 208, 301, 302, 501 are a PNP bipolar transistor, and the transistors 103, 104, 201, 202, 203, 204, 304, 305, 503 are an NPN bipolar transistor.

In operation, both input signal potentials at the input terminals 1 and 2 are applied to the first and second differential amplifiers. That is, both of the two input signals are applied to the I/O circuits 11 and 12.

The I/O circuit 11 outputs a collector current $I_{101}$ of the transistor 101 and a collector current $I_{102}$ of the transistor 102. Likewise, the I/O circuit 12 outputs a collector current $I_{103}$ of the transistor 103 and a collector current of the transistor 104.

The current synthesizing circuit 21 causes the current $I_{102}$ to flow through a line interconnecting the current synthesizing circuits 21 and 24. The current synthesizing circuit 24 outputs the sum of the current $I_{102}$ and current $I_{104}$ as a collector current of the transistor 208. Likewise, the current synthesizing circuit 23 causes the current $I_{103}$ to flow through a line interconnecting the current synthesizing circuits 23 and 22. The current synthesizing circuit 22 outputs the sum of the current $I_{101}$ and current $I_{103}$ as a collector current of the transistor 203.

The current synthesizing circuits 21 to 24 function to synthesize the outputs of the first and second differential amplifiers to provide the synthesized output to the input of the current-to-voltage converter circuit 9.

The clamp circuits 51 and 52 function to inhibit the operation of the first and second differential amplifiers, respectively. In the absence of the clamp circuit 51, the first differential amplifier does not function normally when both of the potentials of the two input signals are $\{V_{cc}-(V_{sat}+V_{BE})\}$ or more. In the absence of the clamp circuit 52, on the other hand, the second differential amplifier does not function normally when both of the potentials of the two input signals are $(V_{sat}+V_{BE})$ or less. For this reason, the clamp circuit 51 renders the first differential amplifier inoperative when both of the input signal potentials are $\{V_{cc}-(V_{BE})\}$ or more, and the clamp circuit 52 renders the second differential amplifier inoperative when both of the input signal potentials are $(V_{sat}+V_{BE})$ or less.

Since the outputs of the first and second differential amplifiers are synthesized by the current synthesizing circuits 21 to 24, the potential range of the input signals of the operational amplifier 1000 is improved as a whole according to the first preferred embodiment. The operation of the clamp circuits 51 and 52 will be discussed in detail hereinafter.

The base-emitter voltage of the transistor 501 in the clamp circuit 51 is designed to equal the base-emitter voltage $V_{BE}$ of the transistors 101 and 102. The voltage of the source 502 is set to $(V_{sat}+V_{BE})$ with respect to the saturation voltage $V_{sat}$ of the transistor 302.

Upon such setting, a collector current flows in the transistor 501, with the base-emitter voltage thereof held at $V_{BE}$, when both of the two input signal potentials at the input terminals 1 and 2 are $\{V_{cc}-(V_{sat}+V_{BE})\}$ or more. Thus the collector-emitter voltage of the transistor 302 does not decrease to $V_{sat}$ or less, preventing the saturation of the transistor 302.

The emitter potential of the transistors 101 and 102 is fixed to $(V_{cc}-V_{sat})$. When the input signal potentials at the input terminals 1 and 2 are $\{V_{cc}-\}V_{sat}+V_{BE})\}$ or more, no base current flows in the transistors 101 and 102 and, accordingly, the collector currents $I_{101}$ and $I_{102}$ are zero, the first differential amplifier being rendered inoperative. The collector current of the transistor 302 flows in the transistor 501 at that time.

At the foregoing input signal potentials, the second differential amplifier operates to cause the collector currents $I_{103}$ and $I_{104}$ of the transistors 103 and 104 to flow. The difference current between the collector currents $I_{103}$ and $I_{104}$ is applied to the current-to-voltage converter circuit 9 by the above-mentioned function of the current synthesizing circuits 21 to 24, providing the output corresponding to the voltages applied to the input terminals 1 and 2.

The clamp circuit 52 operates in a like manner. The base-emitter voltage of the transistor 503 is designed to equal the base-emitter voltage $V_{BE}$ of the transistors 103 and 104. The voltage of the source 504 is set to $(V_{sat}+V_{BE})$ with respect to the saturation voltage $V_{sat}$ of the transistor 305.

Upon such setting, a collector current flows in the transistor 503, with the base-emitter voltage thereof held at $V_{BE}$, when both of the two input signal potentials at the input terminals 1 and 2 are $(V_{sat}+V_{BE})$ or less. Thus the collector-emitter voltage of the transistor 305 does not decrease to $V_{sat}$ or less, preventing the saturation of the transistor 305.

The emitter potential of the transistors 103 and 104 is fixed to $V_{sat}$. When the input signal potentials at the input terminals 1 and 2 are both $(V_{sat}+V_{BE})$ or less, no base current flows in the transistors 103 and 104 and, accordingly, the collector currents $I_{103}$ and $I_{104}$ are zero, the second differential amplifier being rendered inoperative. The collector current of the transistor 305 flows in the transistor 503 at that time.

At the foregoing input signal potentials, the first differential amplifier operates to cause the collector currents $I_{101}$ and $I_{102}$ of the transistors 101 and 102 to flow. The difference current between the collector currents $I_{101}$ and $I_{102}$ is applied to the current-to-voltage converter circuit 9 by the above-mentioned function of the current synthesizing circuits 21 to 24, providing the output corresponding to the voltages applied to the input terminals 1 and 2.

When the two input signal potentials are both high and the second differential amplifier carries out the substantial operation, the transistors 103 and 104 of the second I/O circuit 12 are not saturated until the two input signal potentials become $(V_{cc}-V_{sat})$ or more. Similarly, when the two input signal potentials are both low and the first differential amplifier carries out the substantial operation, the transistors 101 and 102 of the first I/O circuit 11 are not saturated until the two input signal potentials become $V_{sat}$ or less.

It will be appreciated that the potential range of the input signals of the operational amplifier 1000 is limited only by the saturation voltage $V_{sat}$ of the transistors 101 to 104. This permits the wider input signal potential range of $V_{sat}$ to $(V_{cc}-V_{sat})$.

For example, connecting the inverting input terminal 2 to the output terminal 3 and causing the operational amplifier 1000 to function as a voltage follower permits the input signals that fall in the potential range to be outputted without distortion.

Figure 2:
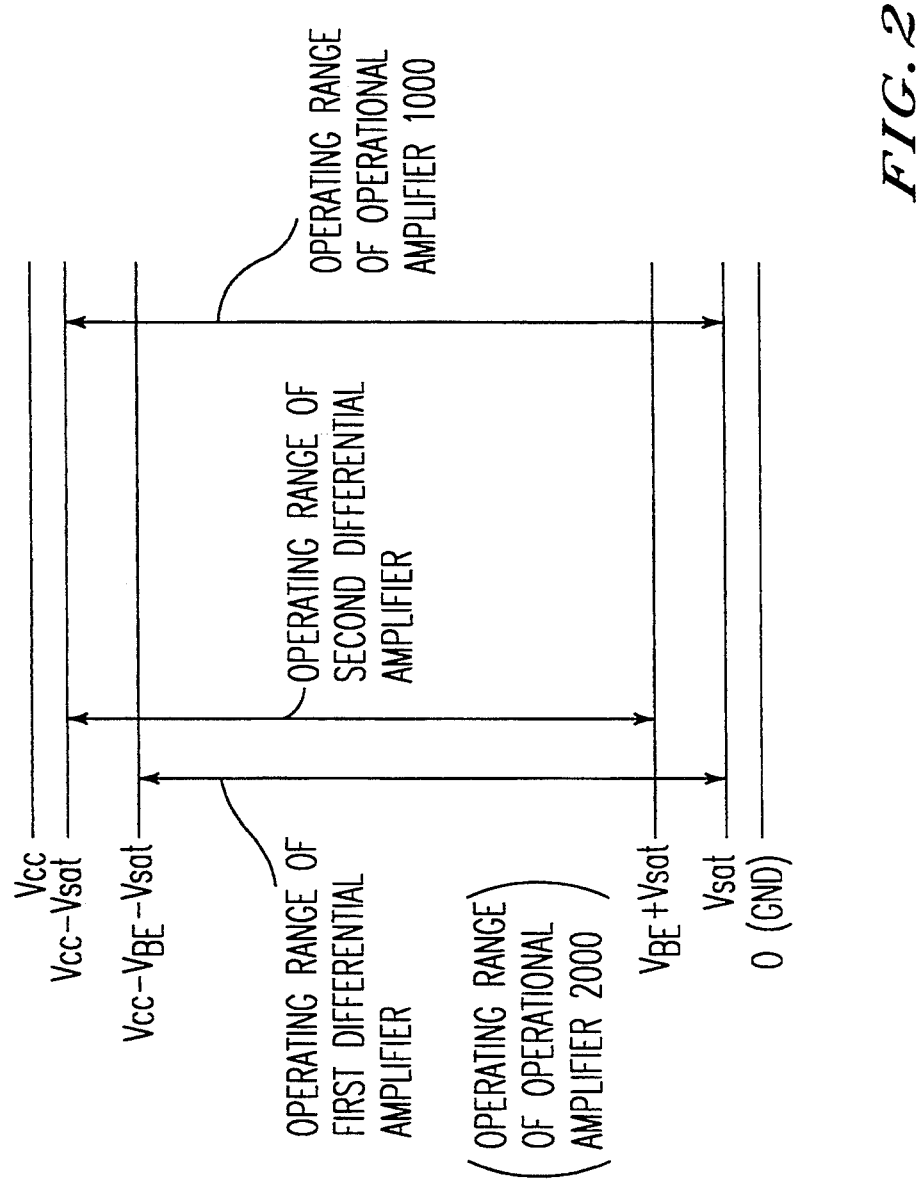
FIG. 2 conceptually delineates the operation of the first preferred embodiment.

FIG. 2 conceptually delineates the input signal potential range within which the operational amplifier 1000 is placed in normal operation. It is apparent from FIG. 2 that the range of the operational amplifier 1000 is wider than that of the conventional operational amplifier 2000.

Figure 3:
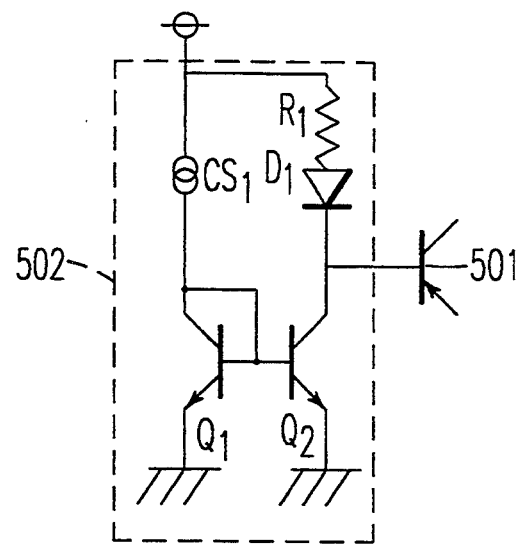
FIGS. 3 and 4 are circuit diagrams delineating the first preferred embodiment.

FIG. 3 is a circuit diagram of the voltage source 502 of the clamp circuit 51. A current source $CS_1$ and a current mirror circuit consisting of two transistors $Q_1$ and $Q_2$ supply current to a resistor $R_2$ and a diode $D_2$. The voltage source 502 is designed such that the resistor $R_1$ generates the voltage ($V_{sat}$. It is not difficult to design so that the base-emitter voltage $V_{BE}$ of the transistors 101 and 102 is obtained in the diode $D_1$, and the potential $\{V_{cc}-(V_{sat}+V_{BE})\}$ may be applied to the base of the transistor 501.

It is also easy to design such that the base-emitter voltage of the transistor 501 equals the base-emitter voltage $V_{BE}$ of the transistors 101 and 102. The clamp circuit 51 designed as above mentioned is accomplished without difficulty.

Figure 4:
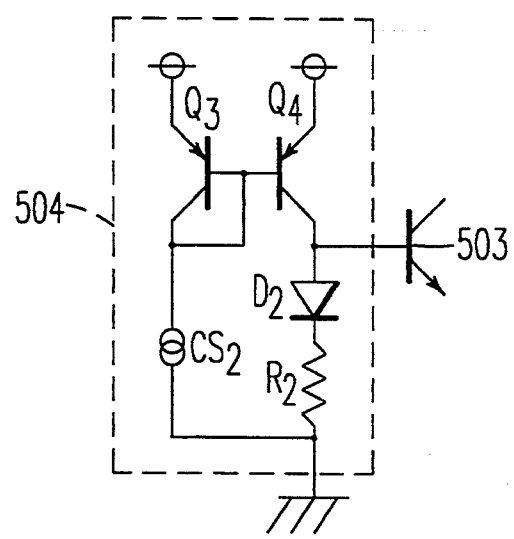

FIG. 4 is a circuit diagram of the voltage source 504 of the clamp circuit 52. A current source $CS_2$ and a current mirror circuit consisting of two transistors $Q_3$ and $Q_4$ supply current to a resistor $R_2$ and a diode $D_2$. The voltage source 504 is designed such that the resistor $R_2$ generates the voltage $V_{sat}$. It is not difficult to design so that the base-emitter voltage $V_{BE}$ of the transistors 103 and 104 is obtained in the diode $D_2$, and the potential $(V_{sat}+V_{BE})$ may be applied to the base of the transistor 503.

It is also easy to design such that the base-emitter voltage of the transistor 503 equals the base-emitter voltage $V_{BE}$ of the transistors 103 and 104. The clamp circuit 52 designed as above mentioned is accomplished without difficulty.

SECOND PREFERRED EMBODIMENT

Figure 5:
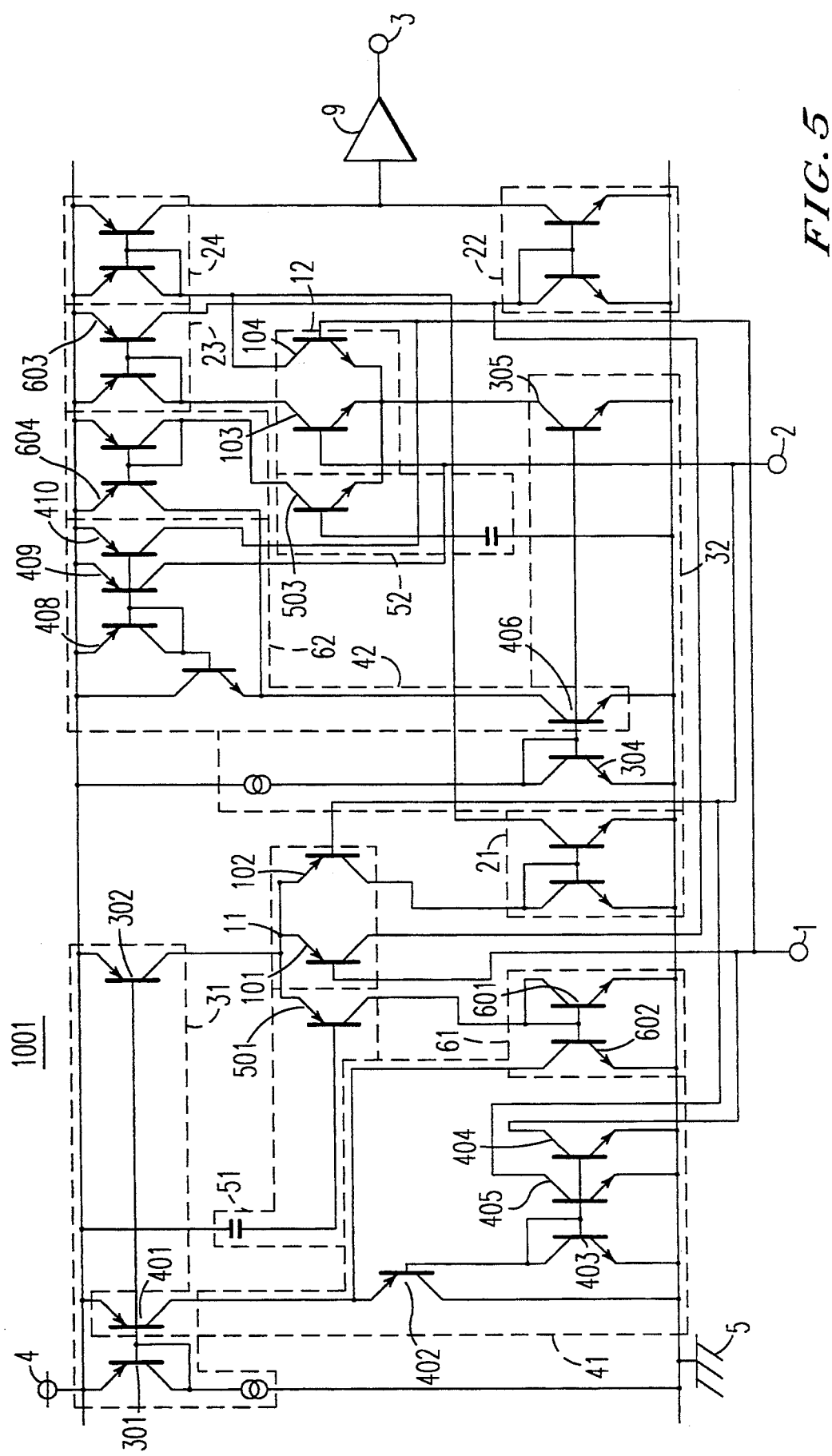
FIG. 5 is a circuit diagram of the amplifier circuit according to a second preferred embodiment of the present invention.

FIG. 5 is a circuit diagram of an operational amplifier 1001 according to a second preferred embodiment of the present invention. The operational amplifier 1001 comprises base current compensating circuits 41, 42 and control circuits 61, 62 for controlling the operation of the circuits 41, 42 in addition to the components of the operational amplifier 1000.

The base current compensating circuit 41 is provided between the potential points 4 and 5 and includes transistors 401 to 405. The emitter of the transistor 401 is connected to the potential point 4, and the base thereof is connected in common to the bases of the transistors 301, 302 of the constant-current circuit 31. The collector of the transistor 402 is connected to the potential point 5, and the emitter thereof is connected to the collector of the transistor 401.

The transistors 403 to 405 form a current mirror circuit. The emitters of the transistors 403 to 405 are connected in common to the potential point 5. The bases of the transistors 403 to 405 and the collector of the transistor 403 are connected in common to the base of the transistor 402.

Likewise, the base current compensating circuit 42 is provided between the potential points 4 and 5 and includes transistors 406 to 410. The emitter of the transistor 406 is connected to the potential point 5, and the base thereof is connected in common to the bases of the transistors 304 and 305. The collector of the transistor 407 is connected to the potential point 4, and the emitter thereof is connected to the collector of the transistor 406.

The transistors 408 to 410 form a current mirror circuit. The emitters of the transistors 408 to 410 are connected in common to the potential point 4. The bases of the transistors 408 to 410 and the collector of the transistor 408 are connected in common to the base of the transistor 407.

The collectors of the transistors 404 and 405 of the base current compensating circuit 41 are connected to the bases of the transistors 101 and 102 of the I/O circuit 11, i.e., to the input terminals 1 and 2, respectively. The transistors 401 and 402 are easily designed in accordance with the same specification as that of the transistors 302 and 101 (102), respectively. The base current compensating current 41 may compensate for the base currents of the transistors 101 and 102.

Similarly, the collectors of the transistors 409 and 410 of the base current compensating circuit 42 are connected to the bases of the transistors 103 and 104 of the I/O circuit 11, i.e., to the input terminals 2 and 1, respectively. The transistors 406 and 407 are easily designed in accordance with the same specification as that of the transistors 305 and 103 (104), respectively. The base current compensating circuit 42 compensates for the base currents of the transistors 103 and 104.

Consequently, the input current of the input signals is decreased whether the first differential amplifier or the second differential amplifier performs the substantial operation of the operational amplifier 1001.

As above described in connection with the first preferred embodiment, the base current of the transistors 101 and 102 does not flow when the input signal potentials are more than $\{V_{cc}-(V_{sat}+V_{BE})\}$. This results in undesired flow of the base compensating current of the base current compensating circuit 41 in the input terminals 1 and 2 while the first differential amplifier does not substantially operate. It is also undesired that, when the input signal potentials are less than $(V_{sat}+V_{BE})$, the base compensating current of the base current compensating circuit 42 flows in the input terminals 1 and 2 while the second differential amplifier does not substantially operate. The control circuits 61 and 62 inhibit the operation of the base current compensating circuits 41 and 42, respectively, under these conditions.

The control circuit 61 includes two transistors 601 and 602 forming a current mirror circuit. The emitters of the transistors 601 and 602 are connected in common to the potential point 5, and the bases thereof are connected in common to the collector of the transistor 601.

The collector of the transistor 601 is connected to the collector of the transistor 501 of the clamp circuit 51, whereas the collector of the transistor 602 is connected to the collector of the transistor 401 of the base current compensating circuit 41. When the input signal potential is not less than $\{V_{cc}-(V_{sat}+V_{BE})\}$, the collector current flows in the transistor 501, so that the base current of the transistor 402 does not flow. The result is no collector current flow in the transistors 404 and 405, that is, no base compensating current flow in the transistors 101 and 102. Thus the input terminals 1 and 2 conduct a minimum of current.

Likewise, the control circuit 62 includes two transistors 603 and 604 forming a current mirror circuit. The emitters of the transistors 603 and 604 are connected in common to the potential point 4, and the bases thereof are connected to the collector of the transistor 603.

The collector of the transistor 603 is connected to the collector of the transistor 503 of the clamp circuit 52, whereas the collector of the transistor 604 is connected to the collector of the transistor 406 of the base current compensating circuit 42. When the input signal potential is not more than $(V_{sat}+V_{BE})$, the collector current flows in the transistor 503, so that the base current of the transistor 407 does not flow. The result is no collector current flow in the transistors 409 and 410, that is, no base compensating current flow in the transistors 103 and 104. Thus the input terminals 1 and 2 conduct a minimum of current.

The second preferred embodiment is effective in that a minimum of current is present in the input terminals 1 and 2, in addition to providing the effect of the first preferred embodiment.

THIRD PREFERRED EMBODIMENT

Figure 6:
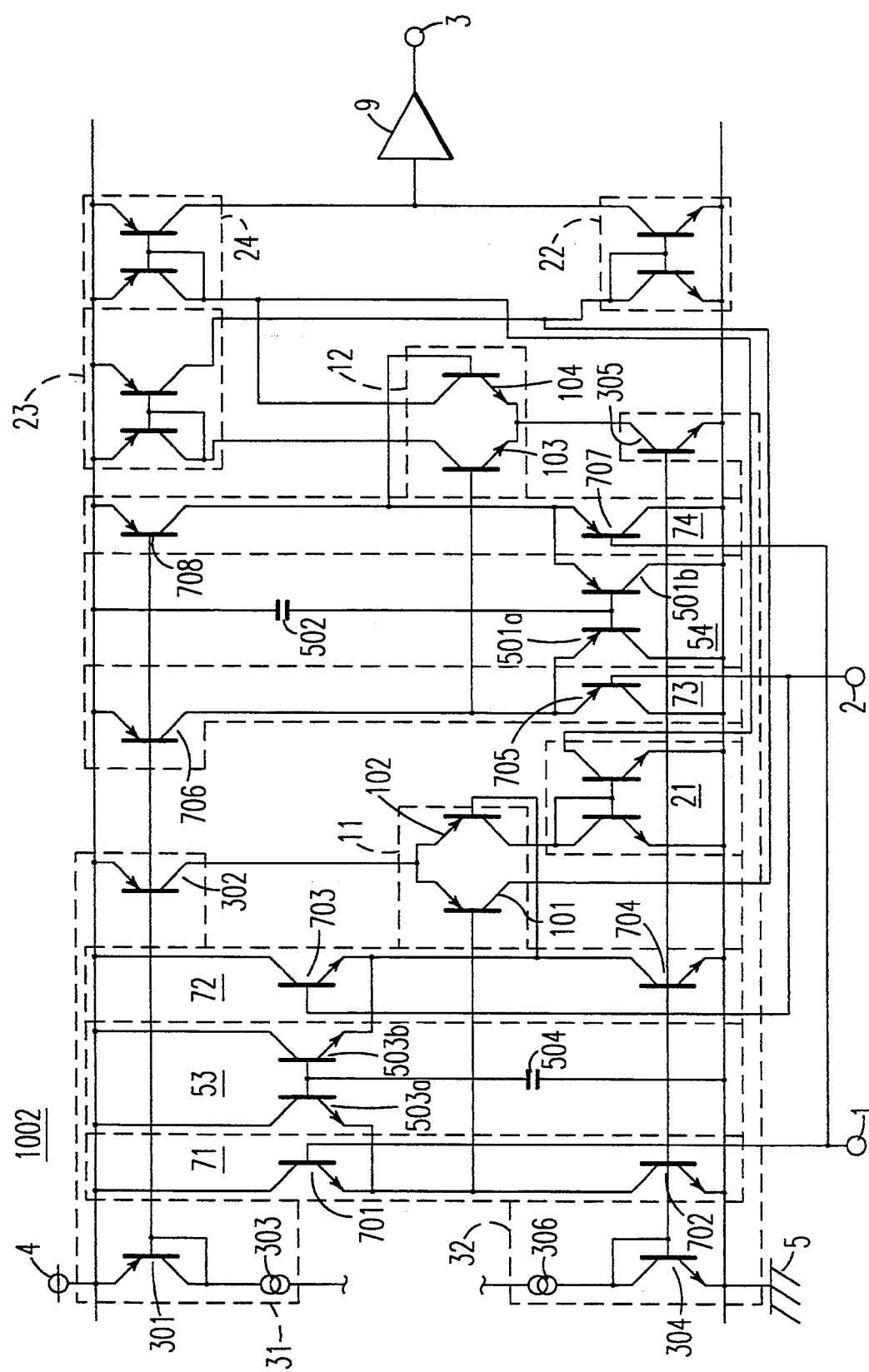
FIG. 6 is a circuit diagram of the amplifier circuit according to a third preferred embodiment of the present invention.

FIG. 6 is a circuit diagram of an operational amplifier 1002 according to a third preferred embodiment of the present invention. The operational amplifier 1002 comprises emitter follower circuits 71 to 74 in addition to the components of the operational amplifier 1000. The clamp circuits 51 and 52 are consequently replaced with clamp circuits 53 and 54.

The emitter follower circuits 71 and 72 are provided between the I/O circuit 11 and the input terminals 1, 2. The emitter follower circuits 73 and 74 are provided between the I/O circuit 12 and the input terminals 1, 2. The emitter follower circuits 71 and 72 function as the preceding circuits of the I/O circuit 11, and the emitter follower circuits 73 and 74 function as the preceding circuits of the I/O circuit 12. The emitter follower circuits 71 and 72 form a first differential amplifier with the I/O circuit 11 and the constant-current circuit 31. The emitter follower circuits 73 and 74 form a second differential amplifier with the I/O circuit 12 and the constant-current circuit 32.

The emitter follower circuit 71 includes two transistors 701 and 702 connected in series between the potential points 4 and 5. The collector of the transistor 701 is connected to the potential point 4, and the emitter of the transistor 702 is connected to the potential point 5. The emitter of the transistor 701 and the collector of the transistor 702 are connected in common to the base of the transistor 101 of the I/O circuit 11.

The base of the transistor 702 is connected in common to the bases of the transistors 304 and 305 of the constant-current circuit 32, and the base of the transistor 701 is connected to the input terminal 1. Thus the emitter follower circuit 71 functions as an emitter follower circuit preceding the transistor 101.

In a like manner, the emitter follower circuit 72 includes two transistors 703 and 704 connected in series between the potential points 4 and 5. The collector of the transistor 703 is connected to the potential point 4, and the emitter of the transistor 704 is connected to the potential point 5. The emitter of the transistor 703 and the collector of the transistor 704 are connected in common to the base of the transistor 102 of the I/O circuit 11.

The base of the transistor 704 is connected in common to the bases of the transistors 304 and 305 of the constant-current circuit 32, and the base of the transistor 703 is connected to the input terminal 2. Thus the emitter follower circuit 72 functions as an emitter follower circuit preceding the transistor 102.

The emitter follower circuit 73 includes two transistors 705 and 706 connected in series between the potential points 4 and 5. The collector of the transistor 705 is connected to the potential point 5, and the emitter of the transistor 706 is connected to the potential point 4. The emitter of the transistor 705 and the collector of the transistor 706 are connected in common to the base of the transistor 103 of the I/O circuit 12.

The base of the transistor 706 is connected in common to the bases of the transistors 301 and 302 of the constant-current circuit 31, and the base of the transistor 705 is connected to the input terminal 2. Thus the emitter follower circuit 73 functions as an emitter follower circuit preceding the transistor 103.

In a like manner, the emitter follower circuit 74 includes two transistors 707 and 708 connected in series between the potential points 4 and 5. The collector of the transistor 707 is connected to the potential point 5, and the emitter of the transistor 708 is connected to the potential point 4. The emitter of the transistor 707 and the collector of the transistor 708 are connected in common to the base of the transistor 104 of the I/O circuit 12.

The base of the transistor 708 is connected in common to the bases of the transistors 301 and 302 of the constant-current circuit 31, and the base of the transistor 707 is connected to the input terminal 1. Thus the emitter follower circuit 74 functions as an emitter follower circuit preceding the transistor 104.

In such an arrangement, the transistors 701 to 704 are an NPN transistor, and the transistors 705 to 708 are a PNP transistor.

The presence of the emitter follower circuits 71, 72 preceding the transistors 101, 102 and the emitter follower circuits 73, 74 preceding the transistors 103, 104 allows a smaller current flow in the input terminals 1 and 2 as compared with the operational amplifier 1000 of the first preferred embodiment.

When the base-emitter voltage of the transistor 701 of the emitter follower circuit 71 and the transistor 703 of the emitter follower circuit 72 is designed to equal the base-emitter voltage $V_{BE}$ of the transistors 101, 102, the transistor 302 of the constant-current circuit 31 is not saturated until the input signal potential reaches $(V_{cc}-V_{sat})$. In relation to the operation of the first differential amplifier, the upper limit of the input signal potential range is advanced up to $(V_{cc}-V_{sat})$. Similarly, when the base-emitter voltage of the transistor 705 of the emitter follower circuit 73 and the transistor 707 of the emitter follower circuit 74 is designed to equal the base-emitter voltage $V_{BE}$ of the transistors 103, 104, the transistor 305 of the constant-current circuit 32 is not saturated until the input signal potential reaches $V_{sat}$. In relation to the operation of the second differential amplifier, the lower limit of the input signal potential range is advanced down to $V_{sat}$.

Unlike the first and second preferred embodiments, the third preferred embodiment has a problem in the lower limit of the input signal potential range for the first differential amplifier and in the upper limit thereof for the second differential amplifier.

In the first differential amplifier, when the transistor 702 of the emitter follower circuit 71 and the transistor 704 of the emitter follower circuit 72 have the same base-emitter voltage $V_{BE}$ as the transistors 101, 102, 701, 703, the transistors 702, 704 might be saturated at an input signal potential of $(V_{sat}+V_{BE})$ or less. In the second differential amplifier, when the transistor 706 of the emitter follower circuit 73 and the transistor 708 of the emitter follower circuit 74 have the same base-emitter voltage $V_{BE}$ as the transistors 103, 104, 705, 707, the transistors 706 and 708 might be saturated at an input signal potential of $\{V_{cc}-(V_{sat}+V_{BE})\}$ or more. The resultant input signal potential range is equal to that of the prior art.

For this reason, the clamp circuits 53 and 54 are substituted for the clamp circuits 51 and 52, respectively, to prevent the saturation of the transistors 702, 704, 706, 708. The clamp circuit 53 is similar in structure to the clamp circuit 52 of the first preferred embodiment, and the clamp circuit 54 is similar in structure to the clamp circuit 51 of the first preferred embodiment.

Specifically, the clamp circuit 53 includes the voltage source 504 and two transistors 503a, 503b. The negative electrode of the voltage source 504 is connected to the potential point 5, and the positive electrode thereof is connected in common to the bases of the transistors 503a and 503b. The collectors of the transistors 503a and 503b are connected in common to the potential point 4. The emitter of the transistor 503a is connected to the emitter of the transistor 701 of the emitter follower circuit 71. The emitter of the transistor 503b is connected to the emitter of the transistor 703 of the emitter follower circuit 72. The emitters of the transistors 503a and 503b are accordingly connected to the transistors 101 and 102 of the I/O circuit 11, respectively.

The base-emitter voltage of the transistors 503a and 503b equals the base-emitter voltage $V_{BE}$ of the transistors 702 and 704, and the voltage of the source 504 is set to $(V_{sat}+V_{BE})$, in the same fashion as the clamp circuit 52.

The clamp circuit 54 includes the voltage source 502 and two transistors 501a and 501b. The positive electrode of the voltage source 502 is connected to the potential point 4, and the negative electrode thereof is connected in common to the bases of the transistors 501a and 501b. The collectors of the transistors 501a and 501b are connected in common to the potential point 5. The emitter of the transistor 501a is connected to the emitter of the transistor 705 of the emitter follower circuit 73. The emitter of the transistor 501b is connected to the emitter of the transistor 707 of the emitter follower circuit 74. The emitters of the transistors 501a and 501b are accordingly connected to the transistors 103 and 104 of the I/O circuit 12, respectively.

The base-emitter voltage of the transistors 501a and 501b equals the base-emitter voltage $V_{BE}$ of the transistors 706 and 708, and the voltage of the source 502 is set to $(V_{sat}+V_{BE})$, in the same fashion as the clamp circuit 51.

In the foregoing arrangement, the transistors 501a and 501b are a PNP transistor, and the transistors 503a and 503b are an NPN transistor.

The collector current of the transistors 702 and 704 preceding the first differential amplifier flows in the transistors 503a and 503b, respectively, when the input signal potential is not more than $(V_{sat}+V_{BE})$. Thus the collector current flowing in the transistors 101 and 102 of the I/O circuit 11 is constant independently of the input signal potentials at the input terminals 1 and 2. The input signals pass through the emitter follower circuits 73 and 74 and are then processed in the second differential amplifier.

The collector current of the transistors 706 and 708 preceding the second differential amplifier flows in the transistors 501a and 501b, respectively, when the input signal potential is not less than $\{V_{cc}-(V_{sat}+V_{BE})\}$. Thus the collector current flowing in the transistors 103 and 104 of the I/O circuit 12 is constant independently of the input signal potentials at the input terminals 1 and 2. The input signals pass through the emitter follower circuits 71 and 72 and are then processed in the first differential amplifier.

It will be appreciated that the lower and upper limits of the input signal potential range of the operational amplifier 1002 are limited by the saturation voltage of the transistor 305 of the second differential amplifier and by the saturation voltage of the transistor 302 of the first differential amplifier, respectively. This affords an advanced input signal potential ranging from $V_{sat}$ to $(V_{cc}-V_{sat})$. Further, the emitter follower circuits are formed in the first and second differential amplifiers to suppress current flowing in the input terminals 1 and 2.

Figure 7:
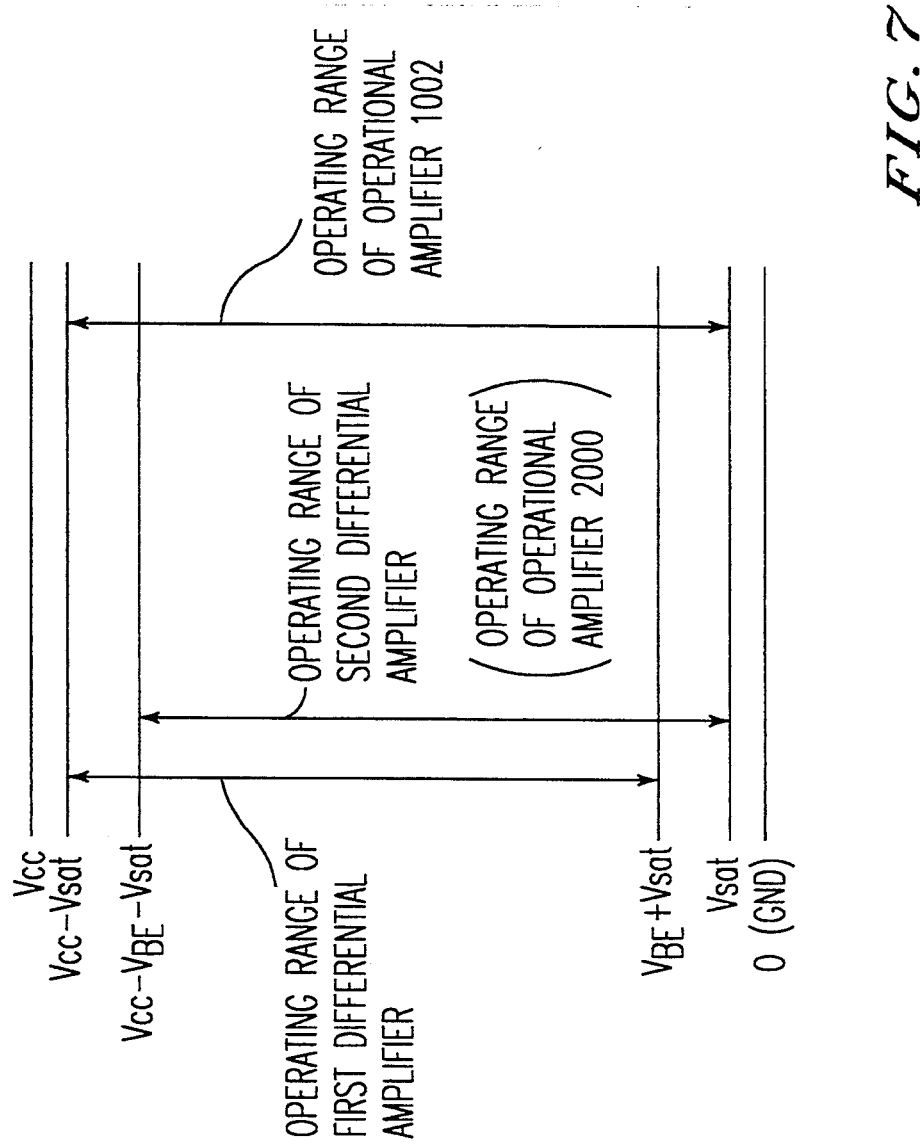
FIG. 7 conceptually delineates the operation of the third preferred embodiment.

FIG. 7 conceptually delineates the input signal potential range within which the operational amplifier 1002 is placed in normal operation. It will be understood that the range of the operational amplifier 1002 is wider than that of the conventional operational amplifier 2000.

FOURTH PREFERRED EMBODIMENT

The fourth preferred embodiment is arranged such that emitter follower circuits precede the first and second differential amplifiers and base current compensating circuits are provided for the transistors forming the emitter follower circuits in the same manner as the second preferred embodiment.

Figure 8A:
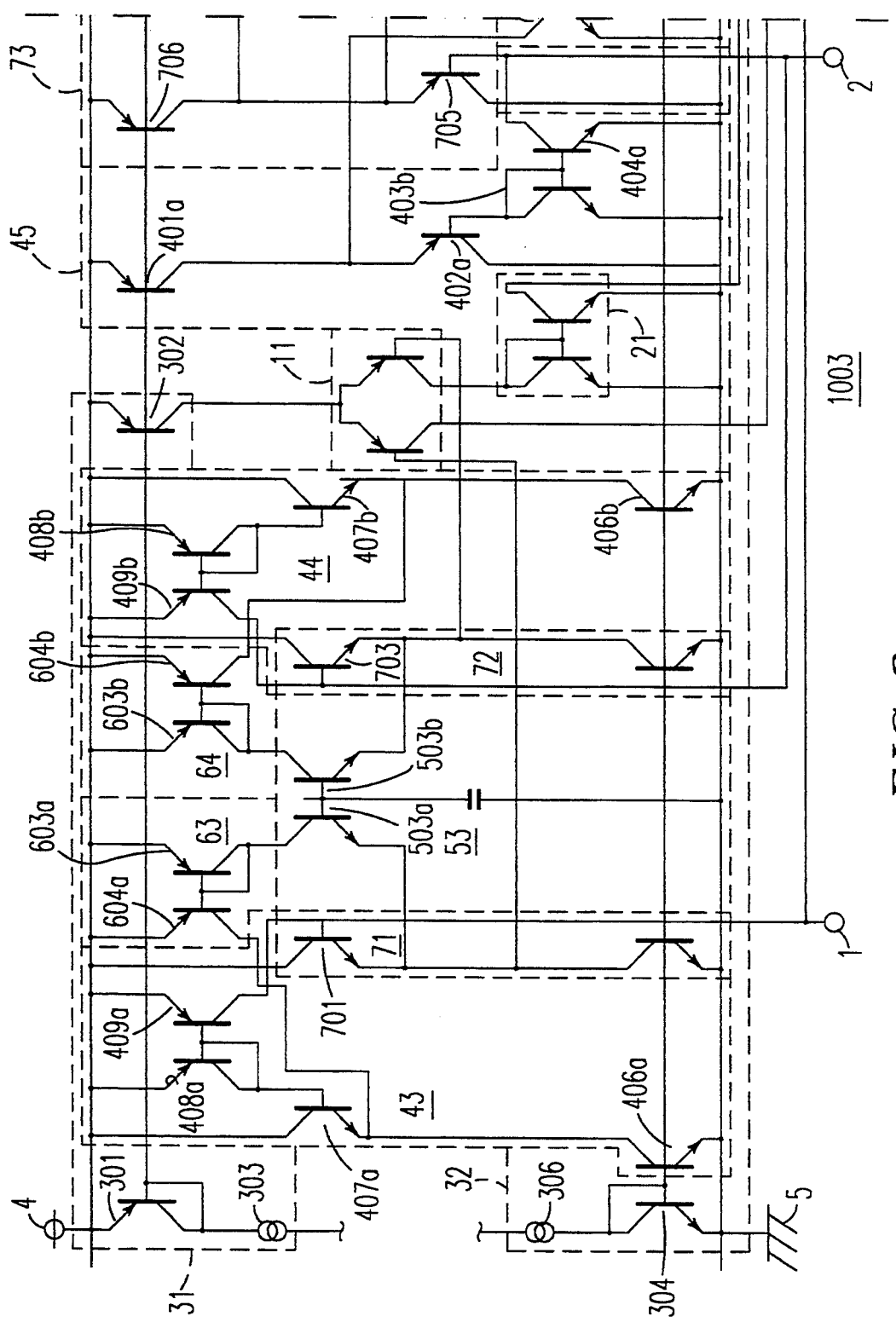
FIG. 8 is a circuit diagram of the amplifier circuit according to a fourth preferred embodiment of the present invention.
Figure 8B:
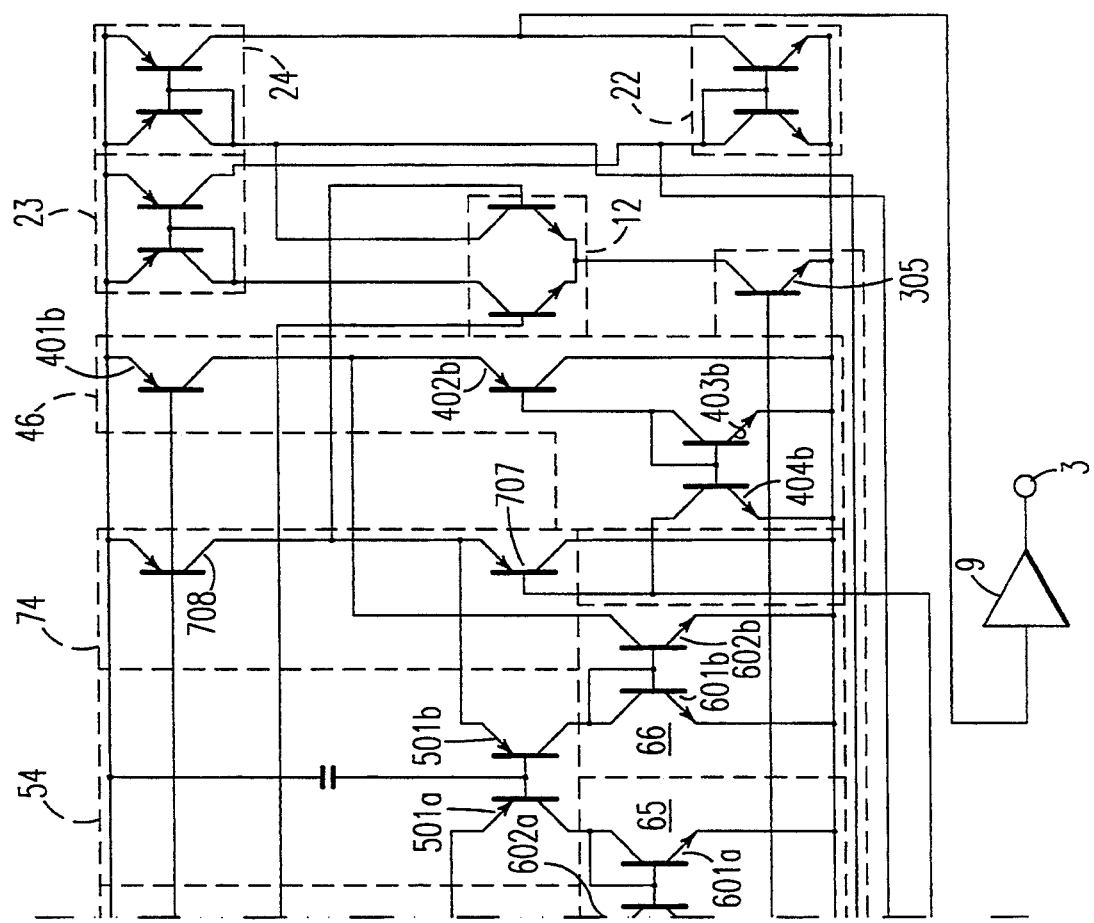

FIG. 8 is a circuit diagram of an operational amplifier 1003 according to the fourth preferred embodiment of the present invention. The operational amplifier 1003 is an improvement of the operational amplifier 1002 of the third preferred embodiment, wherein the current flowing in the input terminals 1 and 2 is further suppressed.

The first differential amplifier is described below. Base current compensating circuits 43 and 44 are provided for the emitter follower circuits 71 and 72 preceding the I/O circuit 11, respectively. Control circuits 63 and 64 are provided for controlling the operation of the base current compensating circuits 43 and 44, respectively.

The base current compensating circuits 43 and 44 have a structure similar to the structure of the base current compensating circuit 42 of the second preferred embodiment. The base current compensating circuit 43 is provided between the potential points 4 and 5 and includes transistors 406a to 409a corresponding to the transistors 406 to 409 of the base current compensating circuit 42. The base current compensating circuit 43 includes no equivalent of the transistor 410 of the base current compensating circuit 42, since the base current compensating circuit 44 is otherwise provided separately to perform the function of the transistor 410. Similarly, the base current compensating circuit 44 is provided between the potential points 4 and 5 and includes transistors 406b to 409b corresponding to the transistors 406 to 409 of the base current compensating circuit 42. The base current compensating circuit 43 performs the function of the transistor 410 of the base current compensating circuit 42 on the base current compensating circuit 44.

The base current compensating circuits 43 and 44 are connected to the input terminals 1 and 2 in the same fashion as the base current compensating circuit 42. Since the input terminals 1 and 2 are connected to the bases of the transistors 701 and 703 of the emitter follower circuits 71 and 72, respectively, the base current compensating circuits 43 and 44 function to compensate for the base current of the transistors 701 and 703, respectively.

The control circuits 63 and 64 have the same structure as the control circuit 62, and include transistors 603a and 603b corresponding to the transistor 603 and transistors 604a and 604b corresponding to the transistor 604, respectively. The control circuits 63 and 64 control the base current compensating circuits 43 and 44 so as not to operate when the input signal potential is less than $(V_{sat}+V_{BE})$.

The above description applies equally to the second differential amplifier. Base current compensating circuits 45 and 46 are provided for the emitter follower circuits 73 and 74 preceding the I/O circuit 12, respectively. Control circuits 65 and 66 are provided for controlling the operation of the base current compensating circuits 45 and 46, respectively.

The base current compensating circuits 45 and 46 have a structure similar to the structure of the base current compensating circuit 41 of the second preferred embodiment. The base current compensating circuit 45 is provided between the potential points 4 and 5 and includes transistors 401a to 404a corresponding to the transistors 401 to 404 of the base current compensating circuit 41. The base current compensating circuit 46 performs the function of the transistor 405 of the base current compensating circuit 41 on the base current compensating circuit 45. Similarly, the base current compensating circuit 46 is provided between the potential points 4 and 5 and includes transistors 401b to 404b corresponding to the transistors 401 to 404 of the base current compensating circuit 41. The base current compensating circuit 45 performs the function of the transistor 405 of the base current compensating circuit 41 on the base current compensating circuit 46.

The base current compensating circuits 45 and 46 function to compensate for the base current of the transistors 705 and 707 of the emitter follower circuits 73 and 74, respectively.

The control circuits 65 and 66 have the same structure as the control circuit 61, and include transistors 601a and 601b corresponding to the transistor 601 and transistors 602a and 602b corresponding to the transistor 602, respectively. The control circuits 65 and 66 control the base current compensating circuits 45 and 46 so as not to operate when the input signal potential is more than $\{V_{cc}-(V_{sat}+V_{EB})\}$.

It will be appreciated that the fourth preferred embodiment has both features of the second and third preferred embodiments. Thus the operational amplifier 1003 has the same input signal potential range as the operational amplifiers 1001 and 1002 of the second and third preferred embodiments and is also effective to further suppress the current flowing in the input terminals 1 and 2.

FIFTH PREFERRED EMBODIMENT

The operational amplifiers 1000 to 1003 of the first to fourth preferred embodiments have improved input signal potential ranges which are, however, limited by the saturation voltage $V_{sat}$ of the transistors. An operational amplifier 1004 according to a fifth preferred embodiment of the present invention is adapted to avoid the limit.

Figure 9:
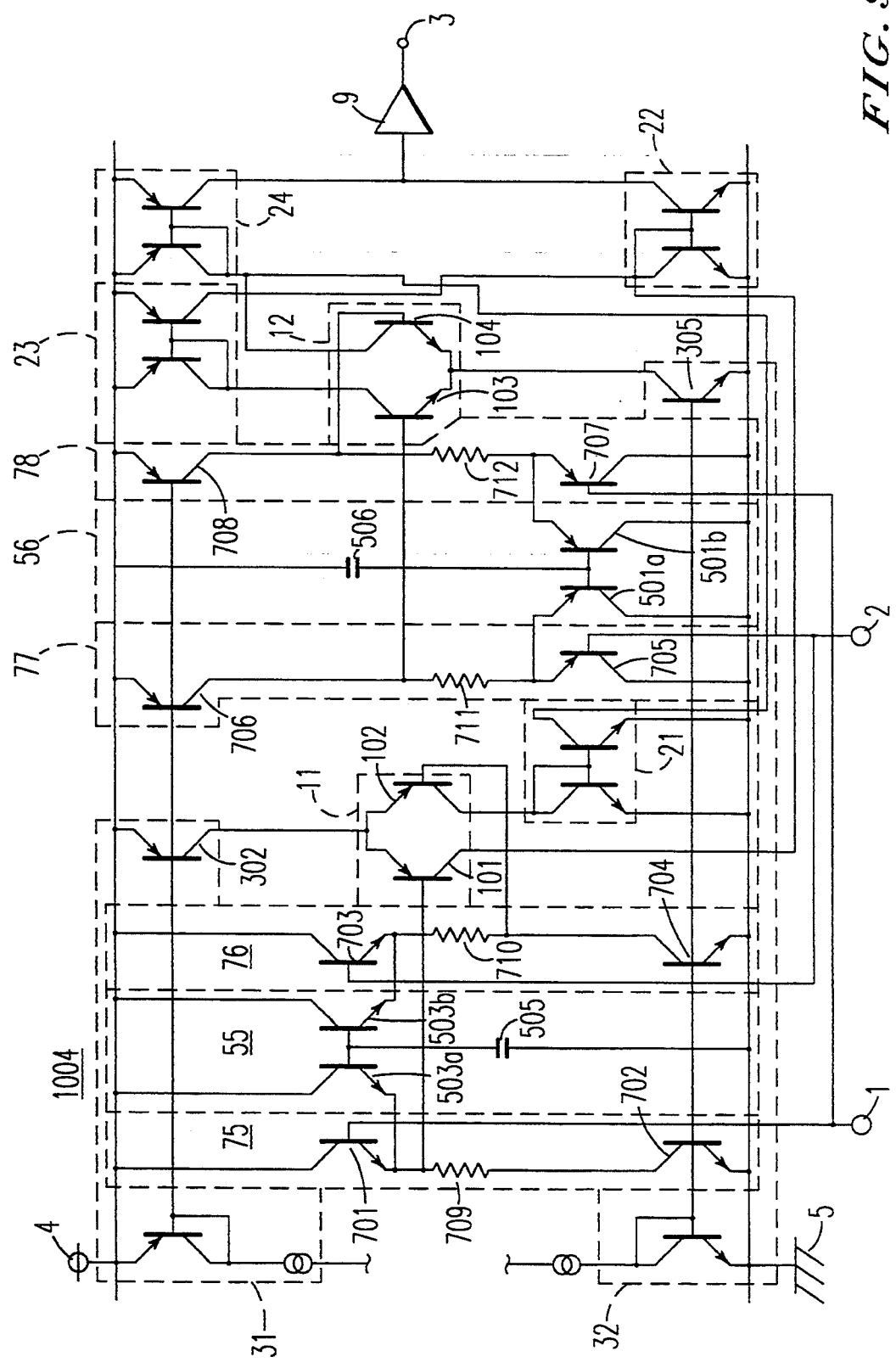
FIG. 9 is a circuit diagram of the amplifier circuit according to a fifth preferred embodiment of the present invention.

FIG. 9 is a circuit diagram of the operational amplifier 1004 of the fifth preferred embodiment according to the present invention. The operational amplifier 1004 is structured in the same way as the operational amplifier 1002 (FIG. 6) of the third preferred embodiment except that emitter follower circuits 75 to 78 are substituted for the emitter follower circuits 71 to 74 of FIG. 6 and clamp circuits 55, 56 are substituted for the clamp circuits 53, 54 of FIG. 6.

The emitter follower circuit 75 differs from the emitter follower circuit 71 in that a resistor 709 is provided between the emitter of the transistor 701 and the collector of the transistor 702. The base of the transistor 101 of the I/O circuit 11 is connected directly to the collector of the transistor 702 and is connected to the emitter of the transistor 701 through the resistor 709.

Likewise, the emitter follower circuit 76 differs from the emitter follower circuit 72 in that a resistor 710 is provided between the emitter of the transistor 703 and the collector of the transistor 704. The base of the transistor 102 of the I/O circuit 11 is connected directly to the collector of the transistor 704 and is connected to the emitter of the transistor 703 through the resistor 710.

The emitter follower circuit 77 differs from the emitter follower circuit 73 in that a resistor 711 is provided between the emitter of the transistor 705 and the collector of the transistor 706. The base of the transistor 103 of the I/O circuit 12 is connected directly to the collector of the transistor 706 and is connected to the emitter of the transistor 705 through the resistor 711.

Likewise, the emitter follower circuit 78 differs from the emitter follower circuit 74 in that a resistor 712 is provided between the emitter of the transistor 707 and the collector of the transistor 708. The base of the transistor 104 of the I/O circuit 12 is connected directly to the collector of the transistor 708 and is connected to the emitter of the transistor 707 through the resistor 712.

The clamp circuits 55, 56 differ from the clamp circuits 53, 54 in the voltage of the voltage source. The clamp circuit 55 includes a voltage source 505 in place of the voltage source 504 of the clamp circuit 53. The clamp circuit 56 includes a voltage source 506 in place of the voltage source 502 of the clamp circuit 54.

The voltage of the source 505 is the sum of the voltage of the source 504 and the amounts of voltage drop at the resistors 709, 710, permitting the upper limit of the input signal potential to become higher. Likewise, the voltage of the source 506 is the sum of the voltage of the source 502 and the amounts of voltage drop at the resistors 711, 712, permitting the lower limit of the input signal potential to become lower.

When the amounts of voltage drop at the resistors 709 and 710 are both designed to equal the saturation voltage $V_{sat}$ of the transistor 302, the input signal potentials at the input terminals 1 and 2 are higher than $(V_{cc} - V_{sat})$ so that the transistor 302 is not saturated at a potential equal to the potential $V_{cc}$ at the potential point 4. It should be noted that the voltage of the source 505 must be set to $(V_{BE} + 2 \times V_{sat})$ to prevent the saturation of the transistors 702, 704.

Similarly, when the amounts of voltage drop at the resistors 711 and 712 are both designed to equal the saturation voltage $V_{sat}$ of the transistor 305, the input signal potentials at the input terminals 1 and 2 are lower than $V_{sat}$ so that the transistor 305 is not saturated at a potential equal to the zero potential (GND) at the potential point 5. It should be noted that the voltage of the source 506 must be set to $(V_{BE} + 2 \times V_{sat})$ to prevent the saturation of the transistors 706, 708.

It will be apparent from the above description that, according to the fifth preferred embodiment, the resistors 709 to 712 serve as a level-shift circuit to cancel the influence of the saturation voltage $V_{sat}$ of the transistors 302, 305 for supplying current in the first and second differential amplifiers. This affords the input signal potential range which is equal to the potential difference between the potential points 4 and 5 ranging from zero (GND) to $V_{cc}$.

Figure 10:
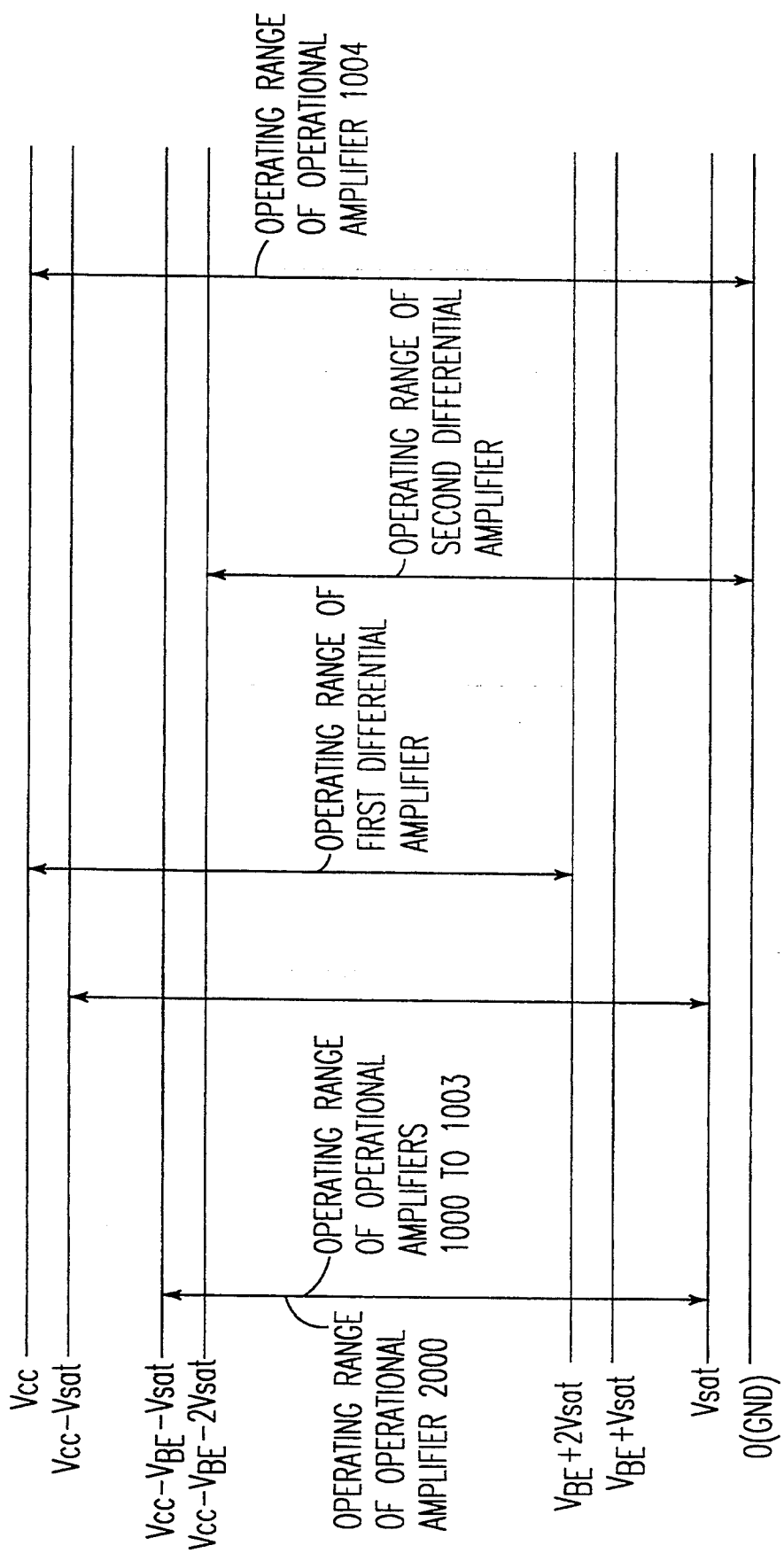
FIG. 10 conceptually delineates the operation of the fifth preferred embodiment.
Figure 11:
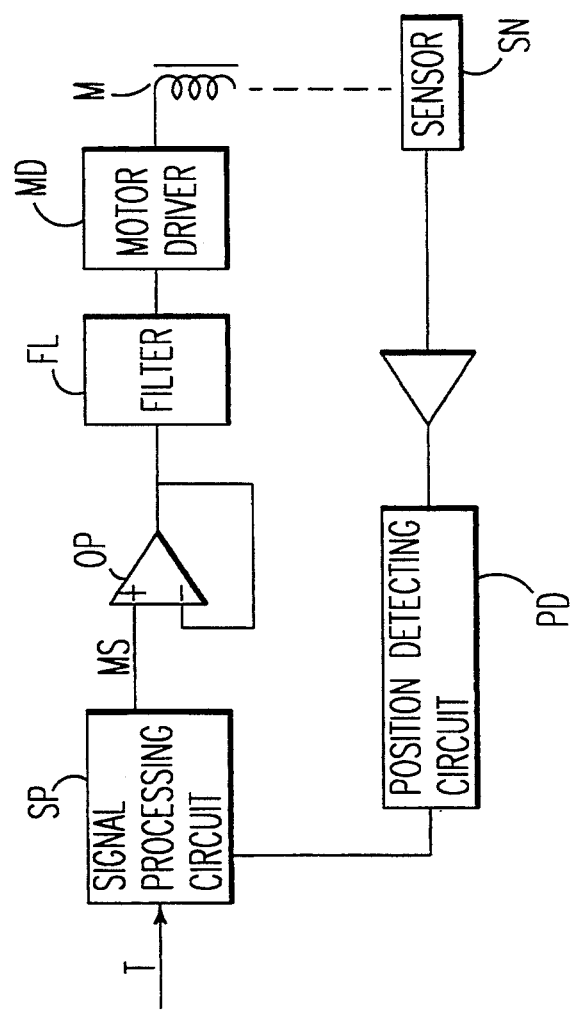
FIG. 11 is a block diagram delineating the background of the present invention.
Figure 12:
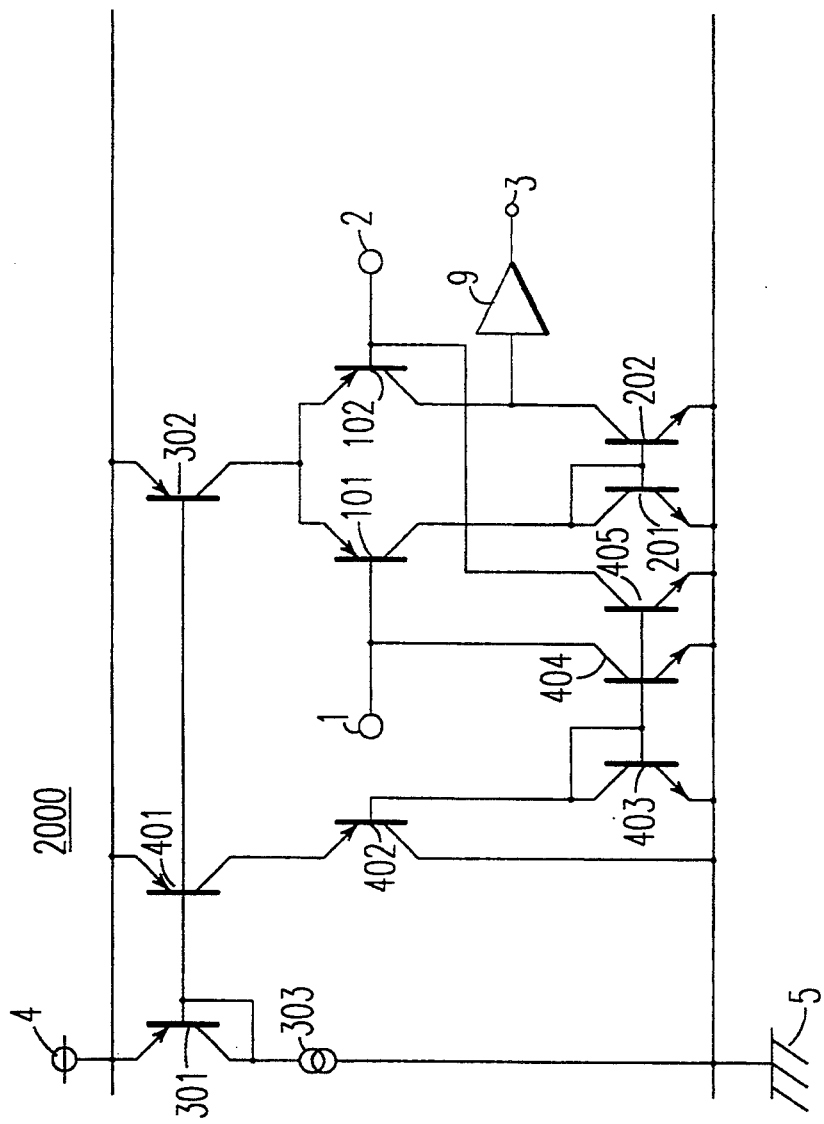
FIG. 12 is a circuit diagram of a conventional amplifier circuit.

FIG. 10 conceptually delineates the input signal potential range within which the operational amplifier 1004 is placed in normal operation. The range of the operational amplifier 1004 is wider than those of the conventional operational amplifier 2000 and the operational amplifiers 1000 to 1003 of the first to fourth preferred embodiments.

Figure 13:
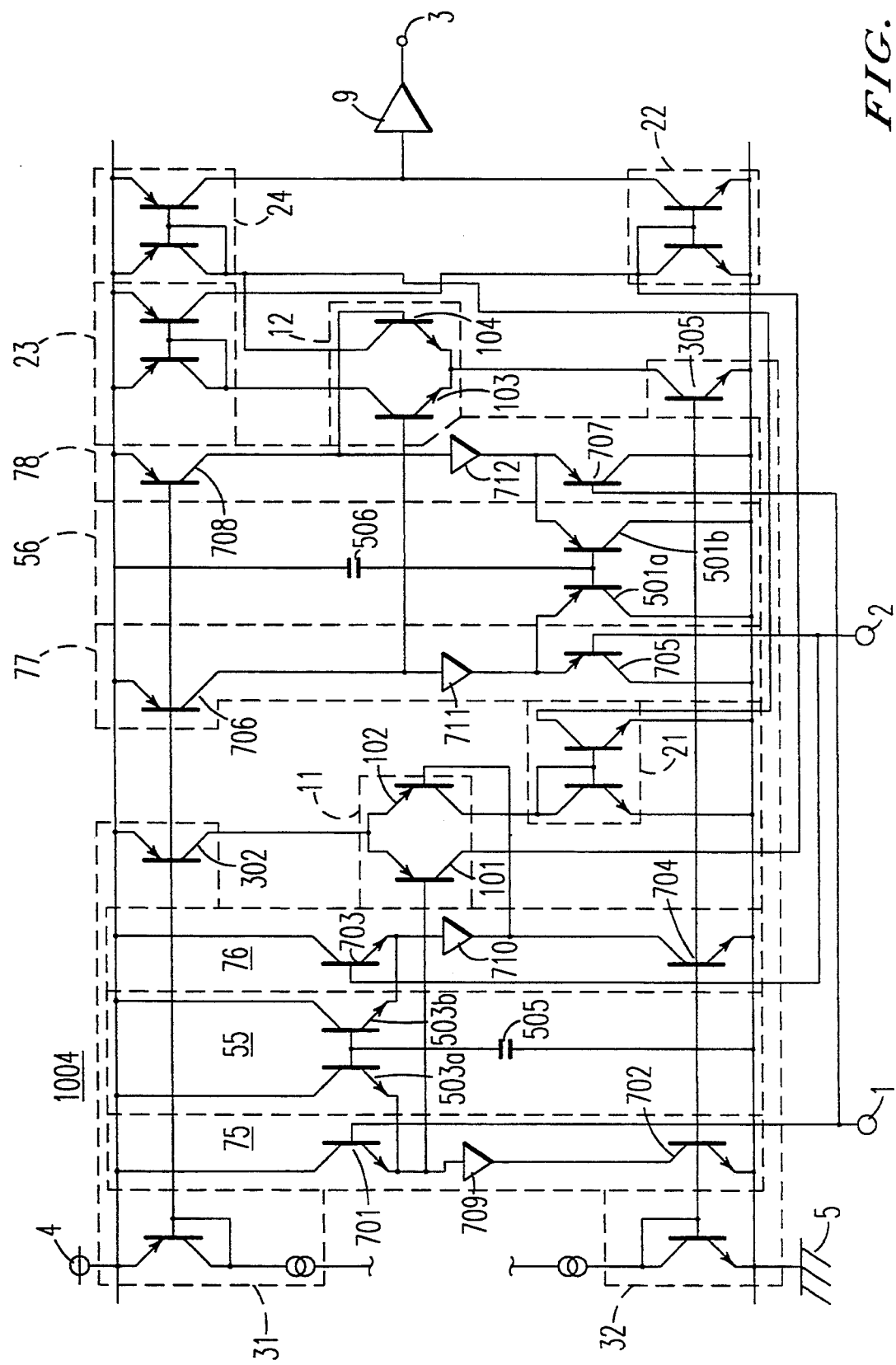
FIG. 13 is a circuit diagram of the amplifier circuit delineating a modification of FIG. 9.

The voltage $V_{sat}$ may be supported by a Schottky barrier diode or a PN diode in place of the resistors 709 to 712 as a level-shift circuit, as shown in FIG. 13.

Variations

In the first to fifth preferred embodiments, the saturation voltages of the transistors are all $V_{sat}$, and the base-emitter voltages of the transistors are all $V_{BE}$. Such designing in the transistors is easy as described in connection with the first preferred embodiment, however, the present invention is not limited to such transistor design.

The current synthesizing circuits 21 to 24 are in the form of the current mirror circuit. The collector current ratio of the two transistors carrying the current is not limited to 1:1.

The present invention may be applied as the voltage follower as described in the first preferred embodiment. It is, however, apparent from the description of the respective preferred embodiments that the present invention is not limited to the application to the voltage follower. That is, it is unnecessary to connect the output terminal 3 to the non-inverting input terminal 2.

While the invention has been shown and described in detail, the foregoing description is in all aspects illustrative and not restrictive. It is therefore understood that numerous modifications and variations can be devised without departing from the scope of the invention.

What is claimed is:

1. An amplifier circuit comprising:
   (a) a first input terminal receiving a first signal which varies from a first value to a second value which is larger than said first value;
   (b) a second input terminal receiving a second signal which varies from said first value to said second value;
   (c) an output terminal;
   (d) a first amplifier which includes;
      (d-1) first input/output means which, includes:
         (d-1-1) first and second inputs which are connected to said first and said second input terminals, respectively;
         (d-1-2) first and second outputs; and
         (d-1-3) a first connecting point,
      in order to operate, said first input/output means requiring a first bias between said first input thereof and said first connecting point and between said second input thereof and said first connecting point, and (d-2) a first constant-current source connected to said first input/output means at said first connecting point for supplying a first predetermined current to said first input/output means, said first constant-current source requiring for its operation that the value at said first connecting point is not more than the value obtained by subtracting a second bias from said second value, said first amplifier dividing and outputting said first predetermined current in response to said first and second signals when at least one of said first and second signals falls in a first range, said first range not including a third value which is more than said first value and not more than said second value but including a fourth value which is not less than said first value and less than said third value and a fifth value which is less than said third value and more than said fourth value, (e) a second amplifier which includes:
 (e-1) second input/output means which includes:
  (e-1-1) first and second inputs connected to said first and second input terminals, respectively;
  (e-1-2) first and second outputs; and
  (e-1-3) a second connecting point in order to operate, said second input/output means requiring a third bias between said first input thereof and said second connecting point and between said second input thereof and said second connecting point
 (e-2) a second constant-current source connected to said second input/output means at said second connecting point for supplying a second predetermined current to said second input/output means, said second constant-current source for its operation requiring that the value at said second connecting point be not less than the sum of a fourth bias and said first value, said second amplifier dividing and outputting said second predetermined current in response to said first and second signals when at least one of said first and second signals falls in a second range, said second range not including said fourth value but including said third and fifth values, (f) first control means which includes:
(f-1) a first transistor having a first current electrode for receiving said first value, a second current electrode connected to said first connecting point, and a control electrode, said first transistor for its operation requiring said first bias between said control electrode thereof and said second current electrode thereof, and
(f-2) a first power source having a negative electrode connected to said control electrode of said first transistor and a positive electrode receiving said second value, a potential difference between said positive electrode and said negative electrode being equal to the sum of said first bias and said second bias, said first control means disabling said first amplifier when both said first and said second signals exceed an upper limit of said first range, (g) second control means which includes:
(g-1) a second transistor having a first current electrode receiving said second value, a second current electrode connected to said second connecting point, and a control electrode, said second transistor for its operation requiring said third bias between said control electrode thereof and said second current electrode thereof, and (g-2) a second power source having a positive electrode connected to said control electrode of said second transistor and a negative electrode receiving said first value, a potential difference between said positive electrode and said negative electrode being equal to the sum of said third bias and said fourth bias, said second control means disabling said second amplifier when both said first and said second signals do not reach a lower limit of said second range, and (h) output synthesizing means for synthesizing an output of said first amplifier and an output of said second amplifier and providing a synthesized signal to said output terminal.

2. The amplifier circuit of claim 1, wherein said first input/output means further includes:

(d-1-4) a third transistor having a control electrode connected to said first input of said first input/output means, a first current electrode connected to said first output of said first input/output means, and a second current electrode connected to said first connecting point and (d-1-5) a fourth transistor having a control electrode connected to said second input of said first input/output means, a first current electrode connected to said second output of said first input/output means, and a second current electrode connected to said first connecting point, and wherein said second input/output means further includes:

(e-1-4) a fifth transistor having a control electrode connected to said first input of said second input/output means, a first current electrode connected to said first output of said second input/output means, and a second current electrode connected to said second connecting point; and (e-1-5) a sixth transistor having a control electrode connected to said said second input of said second input/output means, a first current electrode connected to said second output of said second input/output means, and a second current electrode connected to said second constant-current source.

3. The amplifier circuit of claim 1, wherein said first constant-current source includes:

(d-2-1) a third transistor having a first current electrode connected to said first connecting point, a second current electrode receiving said second value, and a control electrode; and (d-2-2) a fourth transistor having a control electrode connected to said control electrode of said third transistor, a first current electrode connected to said control electrode thereof, and a second current electrode receiving said second value, said third and fourth transistors being paired to form a first current mirror circuit, and wherein said second constant-current source includes:

(e-2-1) a fifth transistor having a first current electrode connected to said second connecting point, a second current electrode receiving said first value, and a control electrode; and (e-2-2) a sixth transistor having a control electrode connected to said control electrode of said fifth transistor, a first current electrode connected to said control electrode thereof, and a second current electrode receiving said first value, said fifth and sixth transistors being paired to form a second current mirror circuit.

4. The amplifier circuit of claim 1, wherein said first and second signals are provided in the form of potential, and said first to fifth values represent potentials.

5. The amplifier circuit of claim 4, wherein the signals output from said first and second amplifiers are provided in the form of current.

6. The amplifier circuit of claim 5, wherein both of said first and second amplifiers output a difference between said first and second signals.

7. The amplifier circuit of claim 1, wherein said output synthesizing means includes:

a first load having a first branch connected to said second output of said first amplifier, and a second branch connected to said first output of said second amplifier;

a second load having a first branch connected to said first output of said first amplifier, and a second branch connected to said output terminal;

a third load having a first branch connected to said second output of said second amplifier, and a second branch connected in common to said first output of said first amplifier and to said first branch of said second load; and a fourth load having a first branch connected in common to said first output of said second amplifier and to said second branch of said first load, and a second branch connected in common to said output terminal and to said second branch of said second load.

8. The amplifier circuit of claim 7, wherein each of said first to fourth loads causes a current proportional to the current flowing in said first branch thereof to flow in said second branch thereof.

9. The amplifier circuit of claim 1, further comprising:

(i) first current compensating means connected to said first and second input terminals for compensating for a current entering said first amplifier; and (j) second current compensating means connected to said first and second input terminals for compensating for a current entering said second amplifier.

10. The amplifier circuit of claim 9, wherein
said first input/output means requires first and second input currents at said first and second inputs thereof in order to operate, and
said first current compensating means includes (i-1) a first current mirror circuit for generating said first and second input currents.

11. The amplifier circuit of claim 10, wherein
said first and second input currents are equal in value,
said first current compensating means generates a first reference current which is equal in value to said first input current and further includes a first branch connected to said first current mirror circuit, and
said first current mirror circuit has (i-1-1) second and third branches connected to said first and second inputs of said first input/output means for conducting a current equal to said first reference current.

12. The amplifier circuit of claim 11, wherein
said second input/output means requires third and fourth input currents at said first and second inputs thereof in order to operate, and
said second current compensating means includes (i-1) a second current mirror circuit for generating said third and fourth input currents.

13. The amplifier circuit of claim 12, wherein
said third and fourth input currents are equal in value,
said second current compensating means generates a second reference current which is equal in value to said third input current and further includes a first branch connected to said second current mirror circuit, and
said second current mirror circuit has (i-1-1) second and third branches connected to said first and second inputs of said second input/output means for conducting a current equal to said second reference current.

14. The amplifier circuit of claim 13, wherein said first input/output means further includes:

(d-1-4) a third transistor having a control electrode connected to said first input of said first input/output means, a first current electrode connected to said first output of said first input/output means, and a second current electrode connected to said first connecting point; and (d-1-5) a fourth transistor having a control electrode connected to said second input of said first input/output means, a first current electrode connected to said second output of said first input/output means, and a second current electrode connected to said first connecting point, wherein said first constant-current source includes:

(d-2-1) a fifth transistor having a first current electrode connected to said first connecting point, a second current electrode receiving said second value, and a control electrode; and (d-2-2) a sixth transistor having a control electrode connected to said control electrode of said fifth transistor, a first current electrode connected to said control electrode thereof, and a second current electrode receiving said second value, said fifth and sixth transistors being paired to form a third current mirror circuit, and wherein said first branch of said first current compensating means includes series connection of a seventh transistor corresponding to said third and fourth transistors and an eighth transistor corresponding to said fifth transistor, said eighth transistor having a control electrode connected to said control electrode of said sixth transistor, wherein said second input/output means further includes:

(e-1-4) a ninth transistor having a control electrode connected to said first input of said second input/output means, a first current electrode connected to said first output of said second input/output means, and a second current electrode connected to said second connecting point; and (e-1-5) a tenth transistor having a control electrode connected to said second input of said second input/output means, a first current electrode connected to said second output of said second input/output means, and a second current electrode connected to said second constant-current source, wherein said second constant-current source includes:

(e-2-1) an eleventh transistor having a first current electrode connected to said second connecting point, a second current electrode receiving said first value, and a control electrode; and (e-2-2) a twelfth transistor having a control electrode connected to said control electrode of said eleventh transistor, a first current electrode connected to said control electrode thereof, and a second current electrode receiving said first value, said eleventh and twelfth transistors being paired to form a fourth current mirror circuit, and wherein said first branch of said second current compensating means includes series connection of a thirteenth transistor corresponding to said eleventh and twelfth transistors and a fourteenth transistor corresponding to said eleventh transistor, said fourteenth transistor having a control electrode connected to said control electrode of said twelfth transistor.

15. The amplifier circuit of claim 9, further comprising:

third control means connected to said first current compensating means for inhibiting the operation of said first current compensating means when both of said first and second signals deviate from said first range; and fourth control means connected to said second current compensating means for inhibiting the operation of said second current compensating means when both of said first and second signals deviate from said second range.

16. The amplifier circuit of claim 15, wherein, when the operation of said first amplifier is inhibited, said first control means causes said first predetermined current to flow to said third control means, bypassing said first input/output means, and said third control means draws said first predetermined current from said first current compensating means, and wherein, when the operation of said second amplifier is inhibited, said second control means causes said second predetermined current to flow to said fourth control means, bypassing said second input/output means, and said fourth control means draws said second predetermined current from said second current compensating means.

17. An amplifier circuit comprising:

(a) a first input terminal receiving a first signal which varies from a first value to a second value which is larger than said first value;

(b) a second input terminal receiving a second signal which varies from said first value to said second value;

(c) an output terminal;

(d) a first amplifier which includes:

(d-1) first input/output means which includes:

(d-1-1) first and second inputs which are connected to said first and said second input terminals, respectively;

(d-1-2) first and second outputs; and (d-1-3) a first connecting point, in order to operate, said first input/output means requiring a first bias between said first input thereof and said first connecting point and between said second input thereof and said first connecting point, (d-2) a first constant-current source connected to said first input/output means at said first connecting point for supplying a first predetermined current to said first input/output means, said first constant-current source requiring for its operation that the value at said first connecting point is not more than the value obtained by subtracting a second bias from said second value, and (d-3) a first voltage follower circuit which is disposed between said first and second input terminals and said first input/output means, said first voltage follower circuit including:

(d-3-1) first and second ends;

(d-3-2) third and fourth ends which are connected to said first and second inputs of said first input/output means, respectively, said first voltage follower circuit for its operation requiring said first bias between said first input terminal and said first end thereof and between said second input terminal and said second end thereof, and requiring that the values at said third and fourth ends thereof be not less than the sum of said first value and a third bias, said first amplifier dividing and outputting said first predetermined current in response to said first and second signals when at least one of said first and second signals falls in a first range, said first range not including a third value which is more than said first value and not more than said second value but including a fourth value which is not less than said first value and less than said third value and a fifth value which is less than said third value and more than said fourth value, (e) a second amplifier which includes:

(e-1) second input/output means which includes:

(e-1-1) first and second inputs connected to said first and second input terminals, respectively;

(e-1-2) first and second outputs; and (e-1-3) a second connecting point, in order to operate, said second input/output means requiring a fourth bias between said first input thereof and said second connecting point and between said second input thereof and said second connecting point, (e-2) a second constant-current source connected to said second input/output means at said second connecting point for supplying a second predetermined current to said second input/output means, said second constant-current source for its operation requiring that the value at said second connecting point be not less than the sum of a fifth bias and said first value, (e-3) a second voltage follower circuit which is disposed between said first and second input terminals and said second input/output means, said second voltage follower circuit including:

(e-3-1) first and second ends (e-3-2) third and fourth ends which are connected to said first and second inputs of said second input/output means, respectively, said second voltage follower circuit requiring said fourth bias between said first input terminal and said first end thereof and between said second input terminal and said second end thereof in order to operate, and requires that the values at said third and fourth ends be not more than the value given by subtracting a sixth bias from said second value, said second amplifier dividing and outputting said second predetermined current in response to said first and second signals when at least one of said first and second signals falls in a second range, said second range not including said fourth value but including said third and fifth values, (f) first control means which includes:
- (f-1) a first transistor having a first current electrode for receiving said second value, a second current electrode connected to said first end of said first voltage follower circuit, and a control electrode, said first transistor for its operation requiring said first bias between said control electrode thereof and said second current electrode thereof,
- (f-2) a second transistor having a first current electrode for receiving said second value, a second current electrode connected to said second end of said first voltage follower circuit, and a control electrode, said second transistor for its operation requiring said first bias between said control electrode thereof and said second current electrode thereof, and
- (f-3) a first power source having a positive electrode which is connected in common to said control electrodes of both said first and said second transistors and a negative electrode receiving said first value, a potential difference between said positive electrode and said negative electrode being equal to the sum of said first to said third biases, said first control means disabling said first amplifier when both said first and said second signals do not reach a lower limit of said first range, (g) second control means which includes:
- (g-1) a third transistor having a first current electrode receiving said first value, a second current electrode connected to said first end of said second voltage follower circuit, and a control electrode, said third transistor for its operation requiring said fourth bias between said control electrode thereof and said second current electrode thereof,
- (g-2) a fourth transistor having a first current electrode receiving said first value, a second current electrode connected to said second end of said second voltage follower circuit, and a control electrode, said fourth transistor for its operation requiring said fourth bias between said control electrode thereof and said second current electrode thereof, and
- (g-3) a second power source having a negative electrode connected in common to said control electrodes of both to said third and said fourth transistors and a positive electrode receiving said second value, a potential difference between said positive electrode and said negative electrode being equal to the sum of said fourth to said sixth biases, said second control means disabling said second amplifier when both said first and said second signals exceed an upper limit of said first range, and (h) output synthesizing means for synthesizing an output of said first amplifier and an output of said second amplifier and providing a synthesized signal to said output terminal.

18. The amplifier circuit of claim 17, further comprising:
first current compensating means connected to said first and second input terminals for compensation for a current entering said first amplifier; and
second current compensating means connected to said first and second input terminals for compensation for a current entering said second amplifier.

19. The amplifier circuit of claim 18, wherein
said first current compensating means includes third control means for inhibiting said compensation when both of said first and second signals deviate from said first range, and
said second current compensating means includes fourth control means for inhibiting said compensation when both of said first and second signals deviate from said second range.

20. The amplifier circuit of claim 17, wherein said first voltage follower circuit includes first level-shift means, and said second voltage follower circuit includes second level-shift means.

21. The amplifier circuit of claim 20, wherein said first level-shift means includes a first voltage holding element connected between said first and third ends of said first voltage follower circuit, and a second voltage holding element connected between said second and fourth ends of said first voltage follower circuit,
wherein said second level-shift means includes a third voltage holding element connected between said first and third ends of said second voltage follower circuit, and a fourth voltage holding element connected between said second and fourth ends of said second voltage follower circuit,
and wherein said first and second voltage holding elements hold said first bias while said third and fourth voltage holding elements hold said fourth bias.

22. The amplifier circuit of claim 21, wherein said first to fourth voltage holding elements are a resistor.

23. The amplifier circuit of claim 21, wherein said first to fourth voltage holding elements are a diode.

* * * * *